United States Patent [19]

Nihei et al.

[11] Patent Number: 4,692,230
[45] Date of Patent: Sep. 8, 1987

[54] THIN FILM FORMING METHOD THROUGH SPUTTERING AND SPUTTERING DEVICE

[75] Inventors: Masayasu Nihei, Hitachi; Masateru Suwa, Ibaraki; Mitsuo Chigasaki, Hitachi, all of Japan

[73] Assignee: Hitachi, Ltd., Tokyo, Japan

[21] Appl. No.: 852,314

[22] Filed: Apr. 15, 1986

[30] Foreign Application Priority Data

Apr. 15, 1985 [JP] Japan .................................. 60-79758

[51] Int. Cl.⁴ .............................................. C23C 14/34
[52] U.S. Cl. ............................ 204/192.31; 204/192.11; 204/192.12; 204/298
[58] Field of Search ........... 204/192 R, 192 N, 192 F, 204/298, 192.1, 192.12, 192.11, 192.31

[56] References Cited

U.S. PATENT DOCUMENTS 4,021,277 5/1977 Shirn et al. ..................... 204/298 X
4,147,573 4/1979 Morimoto ....................... 204/298 X
4,252,626 2/1981 Wright et al. ................... 204/298 X
4,389,299 6/1983 Adachi et al. ...................... 204/298
4,444,635 4/1984 Kobayashi et al. ............. 204/298 X
4,591,417 5/1986 Kaiser et al. .................... 204/192 R

FOREIGN PATENT DOCUMENTS 60-13068 of 1983 Japan .

Primary Examiner—John F. Niebling
Assistant Examiner—Nam X. Nguyen
Attorney, Agent, or Firm—Antonelli, Terry & Wands

[57] ABSTRACT

A method for forming a thin film wherein plural targets of different materials are alternately sputtered througth the switching of the electric powers supplied thereto, the particles produced from the sputtering are ionized and thereafter deposited on a substrate. This method provides an alloy thin film, compound thin film or multi-layer thin film of any composition and enhances adhesion among the particles. A sputtering device for practicing this method is also disclosed.

9 Claims, 4 Drawing Figures

F I G. 1
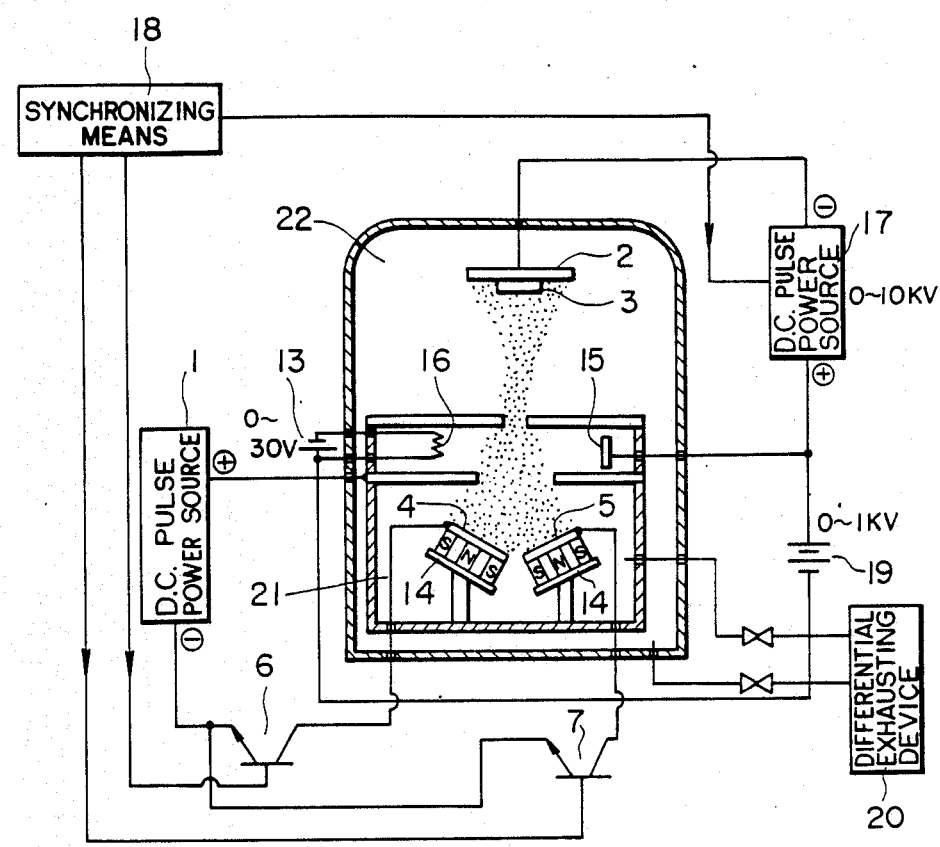
F I G. 2
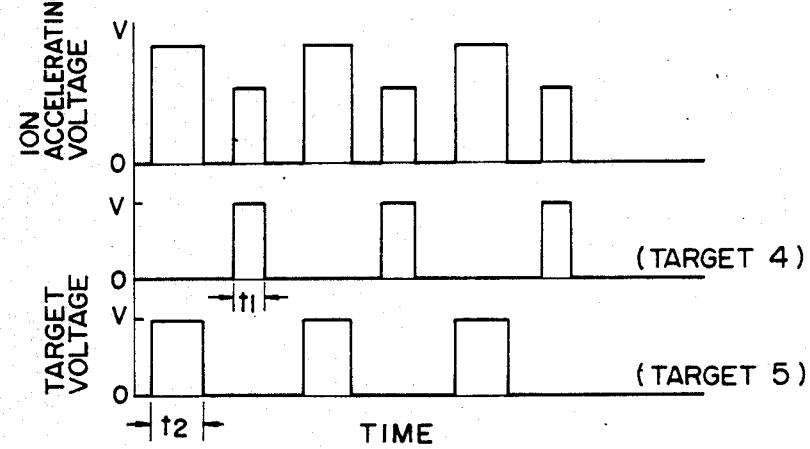

THIN FILM FORMING METHOD THROUGH SPUTTERING AND SPUTTERING DEVICE

BACKGROUND OF THE INVENTION

This invention relates to a method for forming a thin film by means of a sputtering technique and more particularly to a method suitably used to form an alloy thin film, compound thin film or multi-layer thin film. This invention also relates to a sputtering device for forming such a thin film.

When forming an alloy thin film, compound thin film or laminated or multi-layer thin film by means of a sputtering technique, sputtering is generally carried out using an alloy target, compound target or laminated target. However, in the case where the alloy thin film is formed, some combinations of components of the alloy do not provide an alloy target of a uniform composition so that sputtering using this alloy target in turn does not provide an alloy thin film of a uniform composition. Further, in the case of the laminated target, some combinations of components do not permit a laminated structure to be formed or laminated structures made of some combinations of components can not be machined into a target. For example, it is very difficult to form a laminated structure target consisting of ceramics and metals.

There has been proposed in Japanese Patent Unexamined Publication No. 60-13,068 a method for forming a composite thin film such as a compound thin film, laminated thin film, etc. using plural targets in such a manner that sputtering is always carried out from one of the plural target with the other remaining targets interrupted by a shutter. This method, however, is not suitable to provide an alloy thin film of a uniform composition since vaporized particles produced from the respective targets are laminarly deposited on a substrate or wafer. The resultant film has a disadvantage that it provides a weak adhesion between the adjacent layers of the laminated film.

SUMMARY OF THE INVENTION

One object of this invention is to solve the problems as mentioned above and to provide a thin film forming method which can provide a composite thin film, e.g. an alloy thin film, compound thin film, laminated thin film and the like of any composition and enhance adhesion among the particles or between the adjacent layers.

Another object of this invention is to provide a sputtering device suitably used for performing the above thin film forming method.

A feature of the thin forming method according to one aspect of this invention resides in that plural targets of different materials are sputtered by freely switching electric powers to be supplied to them, and vaporized particles produced through the sputtering are ionized to be deposited on a substrate. By ionizing the vaporized particles produced through the sputtering, adhesion among the deposited particles is enhanced. In this case, by switching the electric powers to be supplied to the respective targets in such a manner that the electric power is supplied to only one target at any time, plasma discharge interference among the targets can be prevented. Further, by accelerating the ionized particles, diffusion of atoms or molecules among the deposited particles is facilitated, thereby further enhancing the adhesion thereamong.

Even when a thin laminated film is to be formed by shortening the switching time of the electric powers to be supplied to plural targets, if the ionized particles are accelerated, by diffusing atoms or molecules among the layers of the film, an alloy thin film is formed.

As a sputter power source, the power source having the function of controlling a pulse discharge time or peak electric power in each target is preferably used. Each target is provided with a switching element which can be individually turned on or off, and the switching element sequentially changes at high speeds the pulse discharge time or peak electric power of the corresponding target in accordance with the composition of the alloyed or composite film.

A predetermined composite thin film can be formed by ionizing the particles produced through the sputtering using thermoelectrons or high frequency, and accelerating the ionized particles using an accelerating voltage with its peak voltage or pulse width changed in synchronizm with the switching frequency of the targets so as to individually control the kinetic energy of the particles evaporated from each target and ionized in accordance with each of the components contained in the film. A composite film comprised of a metal and insulator can be formed by supplying a D.C. pulse current to a metallic target while supplying a high frequency current to an insulator target. The high frequency current can conduct through the insulator. Repetition of alternate sputtering of the metallic target and insulator with a shortened sputtering time therefor can provide a thin compound film. Repetition of alternate sputtering of the metallic target and insulator target with a lengthened sputtering time therefor can provide a multi-layer thin film with alternately stacked metallic layers and insulator layers. In the case where a composite thin film comprised of different kinds of insulator is to be formed, the compound thin film or multi-layer thin film can be formed by supplying a high frequency current to each target and adjusting the sputtering time for each target.

The above mentioned thin film forming method according to this invention can be performed using such a sputtering device as mentioned below. This sputtering device comprises at least two kinds of target, a sputtering power source having means for freely changing the pulse width and peak value of the pulse electric power supplied to each target, and means for ionizing the particles produced from the respective targets through the sputtering.

This sputtering device is preferably provided with an ion accelerating means. By providing this ion accelerating means with a power source which is capable of freely changing the pulse width and peak value of the ion accelerating voltage in synchronism with the switching frequency of the targets, an optimum ion accelerating condition in accordance with the kinds of particles produced through the sputtering and the composition of the thin film to be formed can be determined.

As a means for ionizing the particles produced from the target through the sputtering, thermoelectrons of high frequency can be used. The particles produced through the sputtering bear no charge so that they provide a weak adhesion to each other, but the ionized particles provide a strong adhesion to each other.

As a method for ionizing the vaporized particles and depositing them on a substrate so as to form a thin film, an ion-plating technique is known. This technique vaporizes a vaporizing metal by means of resistive heating, electron beams, etc. and deposits a part of metallic vapor with ⊕ ions on the substrate. This technique, however, has a disadvantage that when the alloy is fused and vaporized for forming a composite thin film, the thin film thus formed cannot provide a desired composition because of different vapor pressures of the components of the alloy.

On the other hand, this invention carries out sputtering using plural targets of different materials so that the alloy thin film formed in accordance with this invention can provide a desired composition regardless of different vapor pressures of the components.

BRIEF DESCRIPTION OF THE DRAWINGS

FIG. 1 is a schematic diagram of a composite film forming device in accordance with this invention; and FIGS. 2, 3 and 4 are waveform charts of a sputtering voltage and ion accelerating voltage in this invention.

DESCRIPTION OF THE PREFERRED EMBODIMENTS

Figure 3:
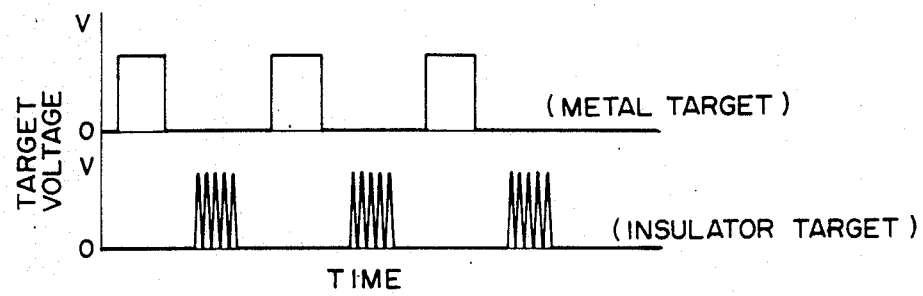

FIG. 1 schematically shows a composite thin film forming device in accordance with this invention. In the figure, 1 denotes a D.C. pulse power source for supplying pulse electric powers to targets 4 and 5. 6 and 7 denote switching elements for alternately switching the D.C. pulses and supplying the power to target 4 or 5, e.g., switching transistors. The particles 3 produced from the targets alternately switched are ionized by an ionizing device comprising a filament heating power source 13, filament 16 and thermoelectron accelerating power source 19.

This device is provided with a D.C. pulse power source 17 for depositing the ionized particles on a substrate 2 with an accelerating voltage with its peak value or pulse width freely changed in synchronism with the switching frequency of the targets; a differential exhausting device 20 for adjusting the ambient pressures of a sputtering chamber 21 and ion accelerating chamber 22; and a control device 18 for synchronizing the switching of switching transistors 6 and 7, and the ion accelerating condition with the sputtering condition.

D.C. pulse power source 1 sets the peak values and pulse widths of the powers supplied to targets 4 and 5.

The sputtering device according to this invention is also provided with magnets 14 at targets 4 and 5 for increasing the respective sputtering rates therefor.

The ionizing device accelerates the thermoelectrons from filament 16 towards a plate 15 and ionizes the particles produced from the targets into ionized particles 3.

FIG. 2 schematically illustrates the waveforms of the sputtering voltage and ion accelerating voltage in the sputtering device shown in FIG. 1. In the case of forming a composite thin film using targets 4 and 5, particles having a required composition are produced by changing a conducting ratio $t_1/(t_1+t_2)$. The particle thus produced are neutral particles and can be regarded as providing a compound composition on the average, but in reality, they alternately emanate from targets 4 and 5 when observed microscopically. These neutral vaporized particles are hit by electrons produced from filament 16 so as to be ionized.

In accordance with this invention, the kinetic energies of the ionized particles from targets 4 and 5 can be individually changed as required in such a way that the ⊕ ionized particles are controlled in their ion energy by varying the ion accelerating voltage in synchronizm with the switching frequency of targets 4 and 5. Thus, the adhesion, density and alloying of the resultant composite thin film can be improved. For example, when the ionized particles from targets 4 and 5 are alternately deposited on substrate 2 with the shortened sputtering times of the targets, they are seldom deposited laminarly but likely to be diffused since they have kinetic energies through the ionization and acceleration, thereby facilitating the alloying and combination.

Moreover, in accordance with this invention, by controlling the ion accelerating voltages matched with the masses of the respective ionized particles, a compound composition consisting of an alloy and a laminated compound can be obtained, and accordingly, this invention can also be applied to the research of new functional materials or the like.

Since thin films formed through sputtering or vacuum evaporation technique are often amorphous, they are generally subjected to heat treatment after the evaporation so as to be crystalized and hence stabilized. On the other hand, in this invention, ionized particles are accelerated and deposited on the substrate through their bombardment so that their crystal nuclei are likely to be produced and grown, and the alloying can be also advanced at the same time with the crystallization. The crystallization can be controlled by varying the peak value and pulse width of each of the ion accelerating voltages in synchronizm with the switching frequency of the targets so that the resultant composite thin film can provide a desired property. The adhesion and density of the thin film can also be adjusted in the same manner.

An example when this invention has been applied to the fabrication of a Cr-Ni thin film resistor body will be explained below. Targets of chromium (Cr) and nickel (Ni) are prepared. The peak voltage to be supplied to the respective targets is fixed at 500 V. The average voltages are set at 200 V for the Ni target and at 300 V for the Cr target. The switching frequency is set at 60 Hz; the ion accelerating voltages are set at 1 KV for the Ni ions and at 1.5 KV for the CR ions; the sputtering chamber ambient pressure (argon: Ar) is set at $2 \times 10^{-3}$ Torr and the ion accelerating chamber is set at $8 \times 10^{-5}$ Torr. For comparison, there has been practiced a method in which the Cr and Ni targets prepared are alternately sputtered and deposited on a substrate without being ionized, and a method in which a Cr-Ni alloy is heated for its vaporization and the ionized vapor is deposited on a substrate.

As a result of X-ray diffraction analysis and electron-microscope observation of the Cr-Ni composite films formed, it has been found that the thin film of this invention is a completely alloyed and good thin film which is crystallized, dense and free from any pinholes. This film indicated a 1.6 times larger strength than the films in the prior arts in a peel test of films. On the other hand, the films in accordance with the prior arts, formed for comparison, were deposited in a mesh-like shape and poorly densified, and showed an amorphous property since their alloying was incomplete.

Figure 4:
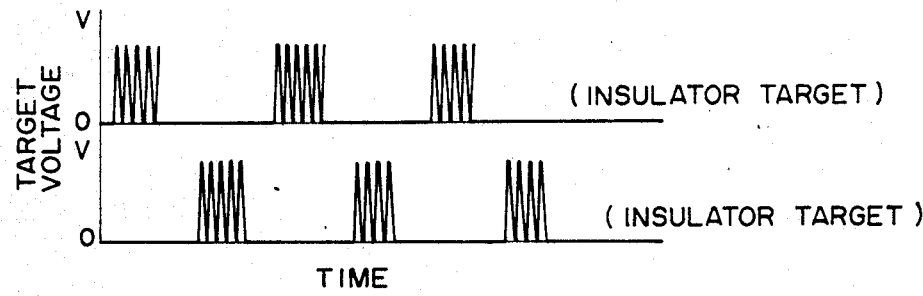

In the above explanation, a method for forming a composite film consisting of one metal and another metal has been described, but a composite film consisting of a metal and insulator can be formed by applying a high frequency voltage to the insulator target, as shown in FIG. 3. Further, a composite film consisting of one insulator and another insulator can be formed by applying a high frequency voltage to both insulator targets, as shown in FIG. 4.

As apparent from the above explanation, in accordance with this invention, a composite thin film, e.g. an alloyed thin film, compound thin film, etc., having any composition can be formed. Further, in accordance with this invention, the crystallization can be controlled without heat treatment to the film deposited on a substrate and also the density and adhesion in the film can be improved so that an ideal composite thin film can be formed.

We claim:

1. A method for forming film, comprising the steps of:
   preparing a plurality of targets formed of different materials;
   switching electric powers from one target to another to sputter said targets so as to deposit produced particles on a substrate;
   ionizing the particles produced from the sputtering and thereafter depositing the ionized particles on the substrate;
   accelerating the ionized particles and thereafter depositing them on a substrate so as to form said film; and
   controlling an accelerating voltage of said ionized particles in synchronism with a switching frequency of said electric powers supplied to the targets.

2. A method for forming a film according to claim 1, wherein electric powers supplied to said targets are switched so as to supply the electric power to only one target at any time.

3. A method for forming a film according to claim 2, wherein the electric powers supplied to said plurality of targets are controlled in their peak value and application time in accordance with a composition of the thin film to be formed.

4. A method for forming a film, comprising the steps of:
   preparing a plurality of targets formed of different materials;
   switching electric powers supplied from one target to another target to sputter said targets so as to deposit produced particles on a substrate;
   ionizing the particles produced through the sputtering; and
   accelerating the ionized particles and thereafter depositing them on a substrate so as to form said film;
   wherein an accelerating voltage of said ionized particles is controlled in synchronism with a switching frequency of said electric powers supplied to the targets.

5. A method for forming a film according to claim 4, wherein electric powers supplied to said targets are switched so as to supply the electric power to only one target at any time.

6. A method for forming a film according to claim 4, wherein the electric powers supplied to said plurality of targets are controlled in their peak value and application time in accordance with a composition of the film to be formed.

7. A sputtering device comprising:
   at least two targets formed of different materials;
   a sputtering power source for supplying electric powers to said targets;
   switching means for switching the electric powers from one of said at least two targets to another of said at least two targets at a switching frequency;
   ionizing means for ionizing particles sputtered by means of said sputtering power source;
   ion accelerating means for accelerating said ionized particles with an accelerating voltage; and
   controlling means for controlling said accelerating voltage in synchronism with said switching frequency.

8. A sputtering device according to claim 7, wherein said ionizing means includes a filament, a filament heating power source and power source for accelerating thermoelectrons emanated from the filament.

9. A sputtering device according to claim 7, wherein said switching means includes a switching element provided between each of said targets and said sputtering power source.

* * * * *